United States Patent [19]
Freitag

[11] Patent Number: 5,066,925
[45] Date of Patent: Nov. 19, 1991

[54] MULTI PUSH-PULL MMIC POWER AMPLIFIER

[75] Inventor: Ronald G. Freitag, Catonsville, Md.

[73] Assignee: Westinghouse Electric Corp., Pittsburgh, Pa.

[21] Appl. No.: 625,398

[22] Filed: Dec. 10, 1990

[51] Int. Cl.$^5$ .............................................. H03F 3/26
[52] U.S. Cl. .................................. 330/269; 330/286; 330/295
[58] Field of Search ................. 330/55, 117, 122, 262, 330/269, 275, 264, 286, 295

[56] References Cited

U.S. PATENT DOCUMENTS

| | | | |
|---|---|---|---|
| 4,547,745 | 10/1988 | Freitag et al. | 330/286 |
| 4,647,868 | 3/1987 | Mueller | 330/295 X |
| 4,749,969 | 6/1988 | Boire et al. | 333/120 |

OTHER PUBLICATIONS

"High-Efficiency 1-, 2-, and 4-W Class-B FET Power Amplifiers", Lane, John R. et al., IEEE Transactions on Microwave Theory and Techniques, vol. MIT-34, No. 12, pp. 1318-1325 (Dec. 1986).
"A 2.5-Watt High Efficiency X-Band Power MMIC", Avasarala, M. et al., IEEE 1989 Microwave and Millimeter-Wave Monolithic Circuits Symposium, pp. 25-28 (1988).

Primary Examiner—James B. Mullins
Attorney, Agent, or Firm—W. G. Sutcliff

[57] ABSTRACT

In a particular embodiment, the invention is directed to a composite MMIC amplifier comprising a plurality of active devices (e.g., FET, HBT, HEMT) arranged on a semiconductor substrate and having inputs and outputs. A pair of input and output transmission lines are coupled in antiphase arrangement to corresponding inputs and outputs of alternate active devices. Each pair of input transmission lines has branched portions extending from a common polarized input terminal. Each branched portion of like polarity extends to a corresponding alternate input and output of an active device and crosses a branched portion of opposite polarity without interference. Impedance matching means is coupled across antiphase pairs of inputs and outputs of adjacent active devices and forms a virtual ground therebetween thereby simplifying the impedance matching circuit.

16 Claims, 4 Drawing Sheets

MULTI PUSH-PULL MMIC POWER AMPLIFIER

BACKGROUND OF THE INVENTION

1. Field of the Invention

The invention relates to a composite amplifier and in particular to a multi push-pull composite MMIC amplifier having simplified impedance matching.

2. Description of the Prior Art

The cost of gallium arsenide GaAs monolithic microwave integrated circuits (MMICs) is directly related to the yield and area of the individual MMIC chips. Lower yield and larger chip area mean fewer good chips per wafer and accordingly result in higher chip cost. MMIC power amplifiers employ large periphery power field effect transistors (FETs). These devices greatly effect the cost of the chip due to the necessity for employing complicated matching and combining circuitry which requires a large chip area. Processing technologies, such as E-beam direct-write gates are currently being used to improve the FET yields. However, the large chip area requirement has remained a problem.

Some approaches such as described by Avasarala et al , "A 2.5 Watt High Efficiency X-band Power MMIC" 1989, IEEE Monolithic Circuits Symposium Digest, pp. 25-28, June 1989 describes a partial matching approach. In the arrangement described, certain critical matching circuitry is placed on the MMIC chip, while the remainder the circuitry is implemented in a hybrid environment. The MMIC chip area is therefore reduced. Unfortunately, the reduced chip cost is substantially offset by the increased cost of assembly in post-production tuning of the circuit. In addition, partially matched power MMICs cannot, in general, be RF tested on the wafer as part of the usual screening procedure.

In a patent R.G. Freitag et al. U.S. Pat. No. 4,547,745 entitled "Composite Amplifier With Divider/Combiner" assigned to Westinghouse Electric Corporation, the assignee herein, a MMIC power combiner is described. A large periphery FET is subdivided into a plurality of smaller MESFETs which are coupled between impedance matched input and output transmission lines. Matching is achieved by means of inductive and capacitive elements which are formed on the chip. Some capacitive elements require a connection to ground through a via formed in the chip. Also the capacitors are typically low Q devices which diminish gain and bandwidth. Large bypass capacitors are also susceptible to failure and can negatively effect yield as one bad capacitor will ruin the entire chip.

SUMMARY OF THE INVENTION

The present invention avoids and eliminates some of the disadvantages and limitations of the described prior arrangements. The present invention employs a plurality of active devices connected to input and output transmission lines in antiphase relation. Antiphase pairs of active devices have impedance means coupled across their inputs and outputs. The result is a MMIC power amplifier having a smaller chip area and reduced circuit losses. The invention results in higher yields due to fewer individual component failures and the overall reduction in the number of components in each individual chip.

In a particular embodiment, the invention is directed to a composite MMIC amplifier comprising a plurality of active devices arranged side-by-side in a row on a semiconductor substrate and having inputs and outputs on respective opposite sides of the row. A pair of input and output transmission lines are coupled in antiphase arrangement to corresponding inputs and outputs of alternate active devices. Each pair of input transmission lines has branched portions extending from a common polarized input terminal. Each branched portion of like polarity extends to a corresponding alternate input of an active devices. Each pair of output transmission lines likewise has branched portion extending from a common polarized output terminal, and each branched portion of like polarity extends to a corresponding alternate output of an active device. Branched portions coupled to adjacent active devices cross in a nonconducting air crossovers such that their lengths are minimized and the area of the semiconductor used for the composite amplifier is reduced. Impedance matching means is coupled across antiphase pairs of inputs and outputs of adjacent active devices and forms a virtual ground therebetween thereby simplifying the impedance matching circuit.

DESCRIPTION OF THE PREFERRED EMBODIMENT

Figure 1:
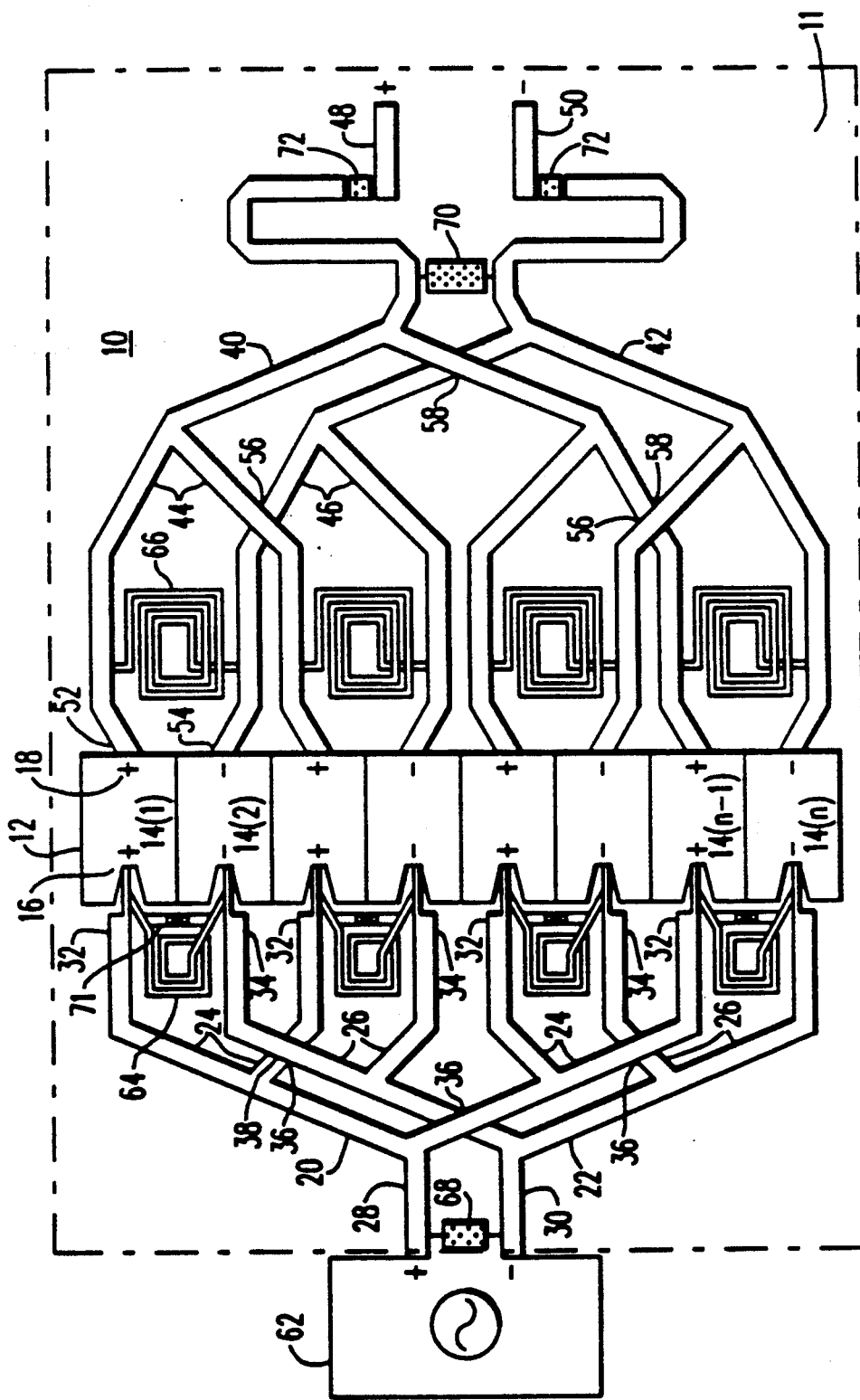
FIG. 1 is a simplified layout of a composite amplifier according to the present invention.

Referring to FIG. 1 there is illustrated a simplified layout of a composite MMIC amplifier 10 formed on a substrate 11 (e.g. GaAs or any other appropriate material known to those skilled in the art) according to the present invention. A large periphery power FET 12 is subdivided into a plurality of elemental active devices or transistors such as FETs 14(1)-14(N). The notation (1) . . . (N) are not used when the particular FET 14 designation is not important. Each FET 14 has an input or gate 16 and an output or drain 18. The FETs 14 are in a "common source" configuration. In accordance with the invention, adjacent FETs, e.g. 14(1)-14(2), 14(3)-14(4) . . . 14(n−1), 14(n) circuitry in an antiparallel arrangement so that input 16 and output 18 of each adjacent FET 14 is oppositely polarized with respect to its neighbor.

Input transmission lines 20 and 22 have corresponding branched portions 24 and 26 and respective common input terminals 28 and 30. The branched portions have respective output terminals 32 and 34 which are coupled in antiphase relationship with inputs 16 of the adjacent pairs of FETs 14 as shown. The input transmission lines 20 and 22 are microstriplines formed on a substrate (not shown in FIG. 1). The branched portions 24, 26 of the microstriplines 20–22 cross at certain locations 36, as shown, forming a nonconductive air crossover 38 between the conductors. The arrangement suitably minimizes space on the substrate 11 without signal interference.

Output transmission lines 40 and 42 are likewise formed of conductive microstriplines having branched portions 44 and 46 and respective common output terminals 48 and 50. Each output microstriplines 40 and 42 has an input ends 52 and 54 coupled in antiphase relationship with the outputs 18 of the FETs 14 as shown. Branched portions 44-46 of the output microstriplines 40-42 cross at 56, forming air crossover 58 which isolate the conductors and efficiently utilize substrate area.

The arrangement in FIG. 1 may be driven in a push-pull mode by an oppositely poled alternating current source 62 coupled across the input terminals 28–30 of transmission lines 20–22. The arrangement has advantages hereinafter described in greater detail.

It is important to note that any type of transistor (e.g., FET, HBT, HEMT) may be used in the multi-push-pull arrangement. This allows the broadest implementation of the invention.

Input inductive matching elements 64 each having an input matching inductance $L_i$ are connected between the inputs 16 of adjacent pairs of FETs 14 as shown. The inductors 64 are thus connected across the oppositely poled input transmission lines 20 and 22. Likewise output inductive matching elements 66 having an output matching inductance $L_o$ are coupled between the outputs 18 of adjacent pairs of FETs 14, and are likewise conductively coupled across the oppositely poled output transmission lines 40 and 42 as illustrated. Since the inductors 64 and 66 straddle the antiphase branches, an RF virtual ground is created at the midpoint of each inductor. The result is effective inductances of $L_i/2$ and $L_o/2$ to RF ground at inputs 16 and outputs 18, respectively. Similarly, an input tuning capacitor 68 is provided between the polarized input terminals 28 and 30 thereby providing shunt capacitance to RF ground. Likewise an output tuning capacitor 70 is coupled across the output terminals 48 and 50. In addition, if desired, series tuning capacitors 72 are provided in the output transmission lines 40 and 42 as illustrated. Resistors 71 coupled between gates of adjacent FETs 14 in parallel with inductors 64 stabilize each FET and provide gain equalization.

Figure 2:
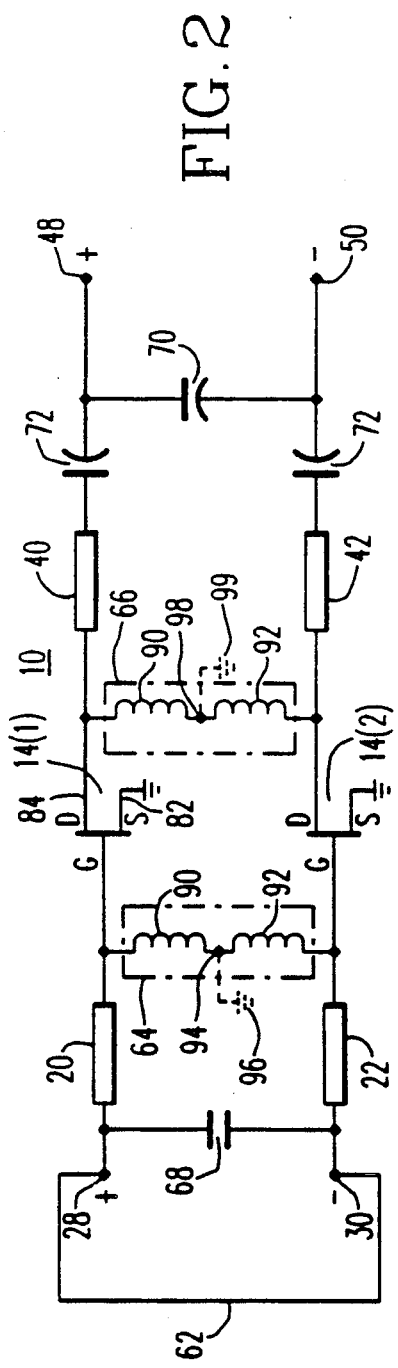
FIG. 2 is a schematic diagram illustrating an equivalent circuit for a pair of antiparallel coupled active devices.

FIG. 2 illustrates a simplified schematic diagram of a single pair of adjacent elemental FETs 14(1)–14(2) shown in FIG. 1. Each FET 14 has a gate 80, a grounded source 82 and a drain 84. The gate 80 of one of the FETs 14(1) is coupled to the polarized input terminal 28 via input transmission line 20. The drain 84 of the FET 14(1) is coupled to the polarized output terminal 48 via the output transmission line 40. The other FET 14(2) is likewise coupled between the polarized input 30 and output 50 by transmission lines 22 and 42. The input matching inductor 64 is coupled between the gates 80 of the FETs 14 as illustrated. The equivalent circuit for the input inductor 64 comprises a pair of inductors 86, 88 each having a value $L_i/2$ which is established by symmetry. Likewise the output inductor 66 is formed of a pair of inductors 90, 92 having a value of $L_o/2$. When operated in a balanced push-pull mode by the source 62, the node 94 between the inductors 86 and 88 forms a virtual RF ground 96 between the gates 80 of the FETs 14. Similarly, in balanced push-pull mode the node 98 between the inductors 90 and 92 forms a virtual RF ground 99 between the drains 84 of the FETs 14. The inductors 64 and 66 match the impedance between the respective input and output transmission lines 20, 22 and 40, 42 without the necessity for a high Q series DC blocking capacitor to ground. The arrangement thereby greatly simplifies the layout and substrate surface area utilization. Also the elimination of the DC blocking capacitor enhances the RF response.

Class B FET power amplifiers exhibiting symmetry between the gates and operating in push-pull mode with hybrid and Wilkinson power splitters are discussed in Lane et al., "High Efficiency 1-, 2-, and 4-W Class-B FET Power Amplifiers", IEEE Trans. Microwave Theory and Tech, Vol. MTT-34, No. 12, December 1986. While the gate-to-gate symmetry on the input takes advantage of the virtual ground to eliminate DC blocking capacitors at the input, the approach is not employed at the output.

Figure 3:
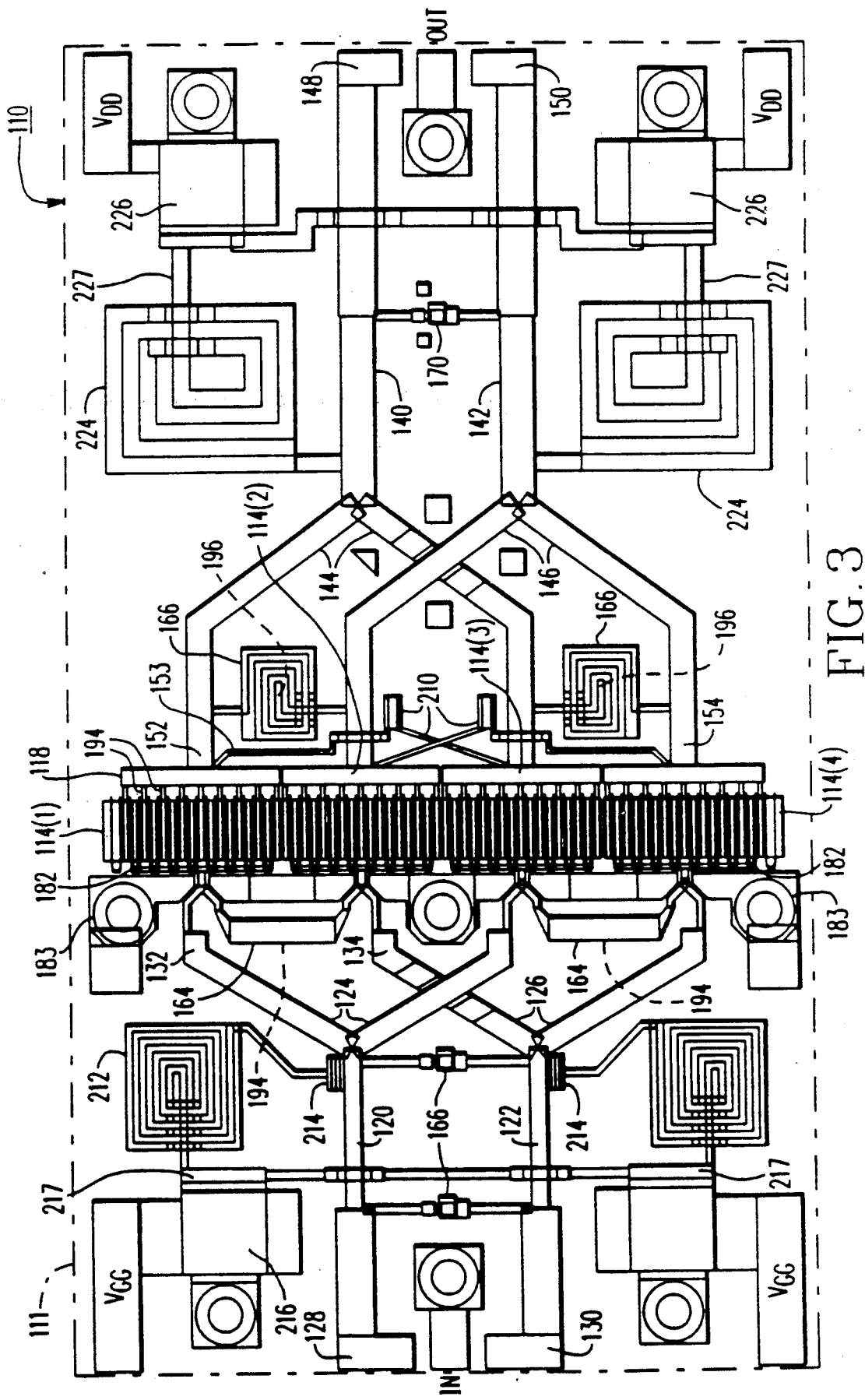
FIG. 3 is a mask layout of a preferred embodiment of the invention illustrating the chip layout in greater detail.
Figures 4, 5:
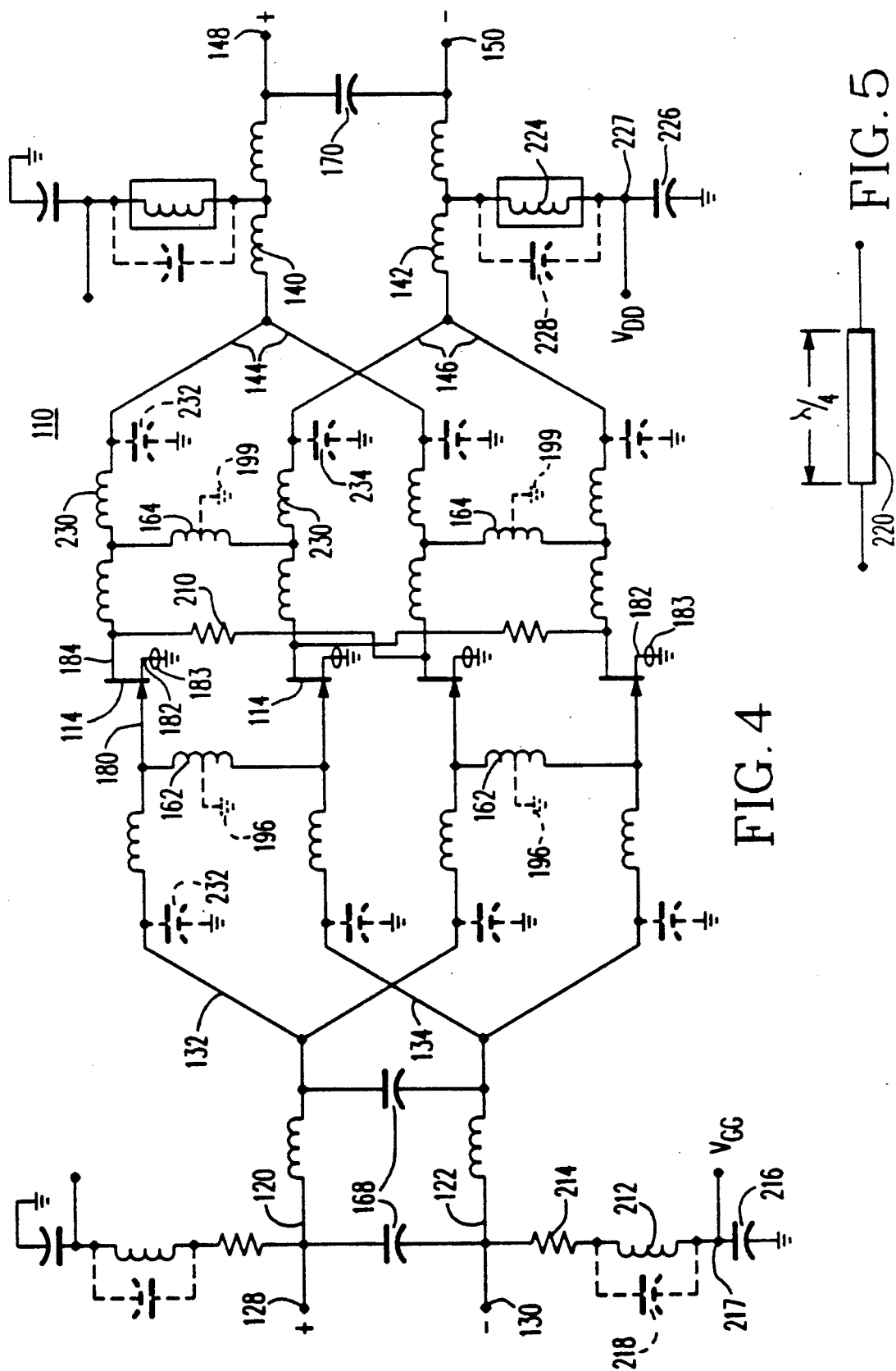
FIG. 4 is a schematic diagram for the embodiment illustrated in FIG. 3.
FIG. 5 illustrates an alternative arrangement for blocking RF signals in a DC bias circuit in FIG. 4.

Referring to FIGS. 3 and 4 there is illustrated a composite amplifier 110 according to the present invention which is similar to the arrangement illustrated in FIGS. 1 and 2 with reference numerals corresponding elements described therein but in a 100 series. In the arrangement, the composite amplifier 110 is disposed on the substrate 111 shown as a dotted rectangle. A plurality of elemental FETs 114(1)–114(4) are provided side-by-side in a row as illustrated. An input transmission line 120 feeds inputs 116 of alternate FETs 114(1) and 114(3). Likewise polarized transmission line 122 feeds the input 116 of FETs 114(2) and 114(4). A polarized alternating voltage source (not shown in FIG. 4) feeds input terminals 128–130 in a manner similar to the arrangement of FIG. 1. Output transmission line 140 is coupled to the outputs 118 of FETs 114(1) and 114(3) and output transmission line 142 is coupled to the outputs of FETs 114(2) and 114(4). The FETs 114 are coupled in antiphase relationship as previously described.

Input matching inductors 164 are coupled across adjacent inputs of antiphase pairs 114(1)–114(2) and 114(3)–114(4). The virtual ground 194 is established in the input inductor element 164. Likewise output matching inductors 166 are coupled across the outputs 118 of the corresponding antiphase pairs of FETs as illustrated and establish virtual ground 196. In the arrangement of FIG. 3, output resistors 153 are coupled between the outputs 118 of the FETs of the same polarity namely 114(1)–114(3) and 114(2)–114(4). The resistors 153 provide stability and prevent oscillation of the FETs.

In a preferred embodiment of the invention, a bias circuit is provided at the input and output of the amplifier 110. On the input side an RF choke 212 for each transmission line 120 and 122 is coupled through a bias resistor 214 and blocking capacitor 216 to ground. DC gate bias voltage $V_{GG}$ is applied to the input transmission lines 120 and 122 at the node 217 between inductor 212 and blocking capacitor 216 to bias the gate 180 of the FETs 114. Parasitic capacitance 218, shown as a dotted line element, represents interwinding capacitance in the choke 212. It should be understood that a quarter wave line 220, shown in FIG. 5, may be substituted for the RF choke 212 which would function to isolate the DC circuit from the RF signals and yet allow implementation of appropriate biasing for the gates 180. On the output side an RF choke 224 and blocking capacitor 226 are serially connected between ground and the output transmission lines 140 and 142. DC drain bias voltage $V_{DD}$ is applied to output transmission lines 140–142 at the node 227 between inductor 224 and capacitor 226 to bias the drains 184 of FETs 114. A parasitic capacitance 228 represented by the dotted element represents interwinding capacitance. Windings of the RF choke 224 may be tailored so that the parasitic capacitance 228 results in a tuned circuit for blocking RF at a frequency of interest. Alternatively, the quarter wave shunt 220 shown in FIG. 5 may be substituted for the RF choke 224. The blocking capacitors 216 and 226 primarily affect the DC circuit and have little or no affect on the RF circuit.

FIG. 4 schematically illustrates an equivalent circuit for the arrangement of FIG. 3. Input transmission line 120 feeds the gate 180 of FETs 114(1) and 114(3) and input transmission line 122 feeds the gate 180 of the FETs 114(2) and 114(4). Likewise, output transmission lines 140 and 142 are respectively coupled to drains 184 of alternate pairs of FETs 114(1)-114(3) and 114(2)-114(4). The source electrode 182 of each FET 114(1)-114(4) is coupled to ground through a via 183 in the substrate 111.

The transmission lines 120, 122, 140 and 142 may be represented schematically as lumped inductances 230 with parasitic capacitance 232 to ground. It should be apparent to those skilled in the art that the various lengths of the transmission lines including the branched portions 132, 134, 144 and 146 and the interline capacitance may be tailored to match as closely as possible the desired overall impedance of the circuit. Input capacitance 168 may be lumped as one element or split as shown. Likewise, output capacitance 170 may be placed across the output lines 148 and 150 as illustrated.

Figure 6:
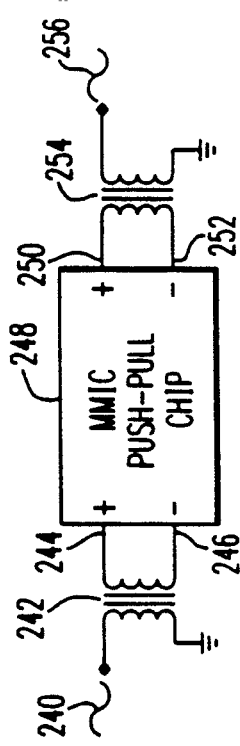
FIG. 6 is an illustration of a transformer balun input/output arrangement for achieving antiphase push-pull operation.

Boire et al. U.S. Pat. No. 4,749,969 "180° Hybrid Tee" illustrates an approach for implementing the feed and combining the output of an antiphase splitter. The preferred approach is discussed with respect to FIG. 6 which illustrates an exemplary transformer balun arrangement for providing push-pull antiphase drive for the arrangements described in FIGS. 1-5 at all frequencies of interest. An input signal 240 to be amplified drives unbalanced input transformer 242 which provides polarized or antiphase inputs 244-246 to the MMIC amplifier 248. The antiphase outputs 250-252 are coupled to the output transformer 254 to deliver amplified output signal 256. Transformers 242-254 couple respective antiphase drives and outputs at all frequencies and further allow a 2:1 impedance advantage available with push-pull operations to be fully exploited.

Figure 7:
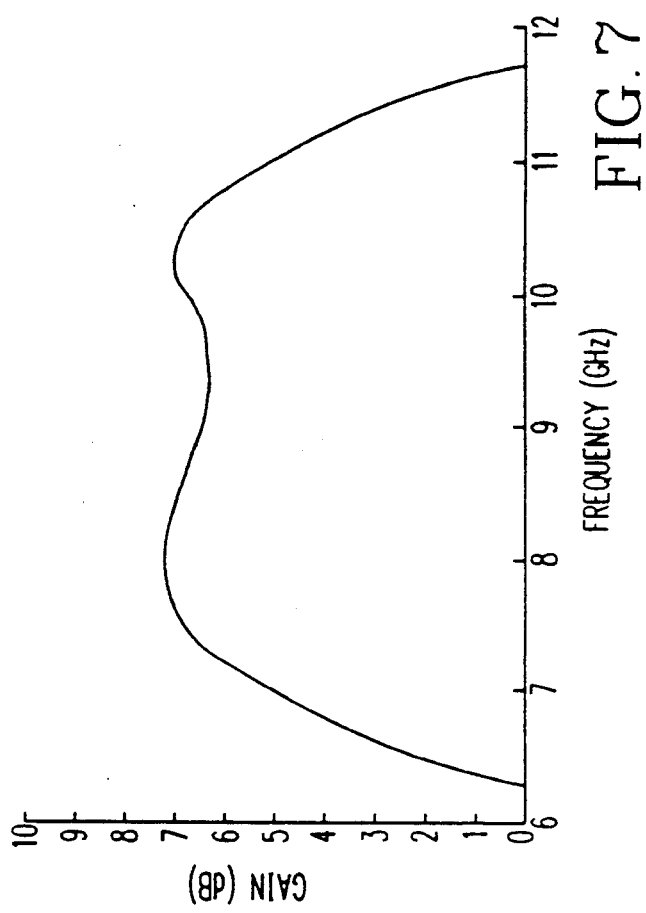
FIG. 7 is a plot of the measured gain versus frequency of the circuit illustrated in FIG. 3.

FIG. 7 illustrates the measured gain response versus frequency achieved with the circuit arrangement of FIG. 3. The absence of relatively low Q bypass capacitors on the chip improves the gain and compensates for the usual losses associated with splitter such as the arrangement herein described. The relatively flat gain response is achieved through an equalization network of inductors 212 and resistors 214 on the input side. The output network in a similar manner matches the FET outputs 118 with the output transmission line.

The large number of bypass capacitors and associated vias to ground usually associated with RF amplifiers of the kind herein described are reduced to a minimum thereby improving chip performance and yield. In addition, chip size is significantly reduced as well, thereby providing more chips per wafer. Large bypass capacitors in particular are susceptible to failure. Also, because the amplifier is complete, the circuit may be RF tested on the wafer prior to dicing to verify performance and to screen the chips.

While there has been described what at present are believed to be the preferred embodiments of the present invention, it will be apparent to those skilled in the art the various changes and modifications may be made therein without departing from the invention, and is intended in the appended claims to cover all such modifications and changes that come within true spirit and scope of the invention.

What is claimed is:

1. A composite MMIC amplifier comprising:
   a plurality of active devices arranged in antiphase pairs on a substrate and having inputs and outputs; and
   a pair of input and output transmission lines respectively coupled in antiphase arrangement to corresponding inputs and outputs of the antiphase pairs of active devices forming a virtual ground therebetween, the input and output transmission lines each include common and branched portions, the branched portions extending between the common portion to which the branched portions are connected and one active device for each branched portion, the branched portions of the input transmission lines crossover and are coupled to the inputs of alternate active devices and the branched portions of the output transmission lines crossover and are coupled to the output terminals of the alternate active devices.

2. The amplifier of claim 1 wherein the transmission lines comprise microstripline conductors.

3. The amplifier of claim 1 wherein the active devices comprise elements of a large area power FET transistor.

4. The amplifier of claim 1 further comprising resistive stabilizer means coupled to the active devices.

5. The amplifier of claim 4 wherein the resistive stabilizer means comprises a resistor coupled between the inputs of antiphase pairs of active devices.

6. The amplifier of claim 4 wherein the resistive stabilizer means comprises a resistive element coupled between outputs of alternate active devices.

7. The amplifier of claim 1 wherein the substrate comprises a gallium arsenide wafer.

8. The amplifier of claim 1 further comprising a source for driving the polarized input of the amplifier and antiphase relation.

9. The amplifier of claim 8 wherein the source comprises a balun transformer.

10. The amplifier of claim 9 further comprising an output circuit including a balun transformer coupled to the polarized outputs of the amplifier.

11. The amplifier of claim 1 wherein the crossovers of branched portions occur without electrical interference.

12. The amplifier of claim 11 wherein the crossovers comprise air crossovers.

13. The amplifier of claim 1, wherein impedance means is coupled across the input and output transmission lines.

14. The amplifier of claim 13 wherein the impedance means comprises an inductance coupled across the input and output transmission lines.

15. The amplifier of claim 14 wherein the inductance comprises a conductive microstripline.

16. The amplifier of claim 14 wherein the inductance comprises a multi-turn planar spiral microstripline.

* * * * *